United States Patent
Williams, Jr. et al.

(10) Patent No.: US 8,783,279 B2
(45) Date of Patent: Jul. 22, 2014

(54) TUBULAR MEMBER WITH THERMAL SLEEVE LINER

(75) Inventors: John B. Williams, Jr., Houston, TX (US); Vinh Nguyen, Houston, TX (US); Jimmy Walker, Jr., Pearland, TX (US)

(73) Assignee: Mogas Industries, Inc., Houston, TX (US)

( * ) Notice: Subject to any disclaimer, the term of this patent is extended or adjusted under 35 U.S.C. 154(b) by 877 days.

(21) Appl. No.: 12/832,713

(22) Filed: Jul. 8, 2010

(65) Prior Publication Data

US 2011/0017305 A1 Jan. 27, 2011

Related U.S. Application Data

(60) Provisional application No. 61/228,442, filed on Jul. 24, 2009.

(51) Int. Cl.
*F16L 7/00* (2006.01)

(52) U.S. Cl.
USPC .......... 137/15.22; 137/613; 137/375; 138/145

(58) Field of Classification Search
USPC .............. 137/1, 613, 375, 15.22; 251/315.01, 251/315.04, 315.1, 315.13; 138/141, 145, 138/146
See application file for complete search history.

(56) References Cited

U.S. PATENT DOCUMENTS

| | | | |
|---|---|---|---|
| 2,419,278 A | | 4/1947 | Motsenbocker, Jr. |
| 3,461,523 A | | 8/1969 | Peehs et al. |
| 3,528,447 A | * | 9/1970 | Kolb .............................. 137/240 |
| 3,532,476 A | | 10/1970 | Peehs et al. |
| 4,011,354 A | * | 3/1977 | Drostholm et al. ........... 427/195 |
| 4,269,218 A | | 5/1981 | Sudo |
| 4,538,834 A | | 9/1985 | Brady |
| 4,774,926 A | | 10/1988 | Adams |
| 4,791,953 A | * | 12/1988 | Berchem ....................... 137/375 |
| 5,080,977 A | | 1/1992 | Zaplatynsky |

(Continued)

FOREIGN PATENT DOCUMENTS

| | | |
|---|---|---|
| DE | 3214918 | 11/1983 |
| EP | 1428909 | 6/2004 |
| FR | 2269022 | 11/1975 |
| JP | 03092618 | 4/1991 |

OTHER PUBLICATIONS

Hass, Derek D., "Directed Vapor Deposition of Thermal Barrier Coatings," Chapter 2, Ph.D. Dissertation, University of Virginia, available at http://www.ipm.virginia.edu/research/PVD/Pubs/thesis6/ (2000).

*Primary Examiner* — Kevin Lee
(74) *Attorney, Agent, or Firm* — Daniel N. Lundeen; Lundeen & Lundeen PLLC

(57) ABSTRACT

A tubular fluid flow device of varying outside dimensions adapted for use in a high pressure, rapidly cycling temperature environment, an isolation ball valve, a ball valve isolation method and a catalyst transfer method. The flow device 10 can have a tubular member 12 having at least one locus 14, 16 of non-uniform outside dimension and an axial flow passage 20 with a uniform inside diameter between opposite end connection elements. A thermal sleeve liner 22 can be disposed about the axial flow passage in a bore 24 formed in the tubular member, wherein the sleeve comprises an outer surface having a thermal barrier coating 26. A pressure-relief passage 28 is provided in fluid communication between the axial flow passage and an interface between an exterior surface of the thermal sleeve liner and an inner surface of the bore.

20 Claims, 5 Drawing Sheets

(56) References Cited

U.S. PATENT DOCUMENTS

| | | | |
|---|---|---|---|
| 5,123,439 A * | 6/1992 | Powers | 137/375 |
| 5,149,142 A | 9/1992 | Walko | |
| 5,267,722 A * | 12/1993 | Coulter | 251/315.01 |
| 5,271,427 A * | 12/1993 | Berchem | 137/375 |
| 5,350,011 A | 9/1994 | Sylvester | |
| 5,419,371 A | 5/1995 | Berchem | |
| 5,460,002 A * | 10/1995 | Correa | 60/723 |
| 5,589,144 A | 12/1996 | Filippi | |
| 6,460,559 B2 * | 10/2002 | Smith, Jr. et al. | 137/15.22 |
| 6,575,197 B2 | 6/2003 | Esser | |
| 6,634,388 B1 | 10/2003 | Taylor | |
| 6,663,919 B2 * | 12/2003 | Farmer et al. | 427/453 |
| 6,921,014 B2 * | 7/2005 | Hasz et al. | 228/122.1 |
| 7,191,770 B1 | 3/2007 | Anderson et al. | |
| 7,219,877 B1 | 5/2007 | Mogas et al. | |
| 8,047,228 B2 * | 11/2011 | Depierri et al. | 137/547 |
| 8,192,688 B2 | 6/2012 | Hagen | |
| 2005/0052019 A1 | 3/2005 | Schroeder | |
| 2007/0012175 A1 | 1/2007 | Miyamoto et al. | |
| 2007/0012176 A1 | 1/2007 | Takami et al. | |
| 2007/0012179 A1 | 1/2007 | Takami et al. | |
| 2009/0032762 A1 | 2/2009 | Junier | |
| 2010/0071798 A1 | 3/2010 | Tsapatsaris | |

\* cited by examiner

TUBULAR MEMBER WITH THERMAL SLEEVE LINER

CROSS REFERENCE TO RELATED APPLICATION

This application claims the benefit of and priority to provisional application U.S. 61/228,442, filed Jul. 24, 2009.

BACKGROUND OF THE INVENTION

The present invention relates to tubular fluid flow devices having a varied outer dimension and which are used in high pressure, rapidly cycling temperature environments, and more particularly to such devices employed in severe service metal-seated isolation ball valves, ball valve isolation methods, catalyst transfer, for example, to or from a reactor such as an ebullated bed reactor, and the like.

In some severe service environments, line isolation valves are subjected to frequent and extreme temperature and pressure cycles as the valve is opened and closed. Because the valve components have different dimensions, for example where end connectors such as flanges are employed, heat transfer may not be uniform and stresses can develop within the materials of construction, which may lead to premature thermal fatigue stress cracking.

In the transfer of catalyst from a reactor, for example, the isolation valves in the transfer line which are initially at ambient temperature may be fully opened to receive the flow of catalyst fines at temperatures over 400° C., rapidly heating the valve components. When the transfer is completed, the isolation valve is closed and cools to ambient temperature before another transfer cycle is initiated. The thermal/pressure cycle may be repeated more than once a day. Because components in thermal contact with the hot fluid flow can be asymmetrical and/or have different dimensions such that heat transfer occurs at different rates to produce temperature differences in the materials, isolation valves used in this service can suffer from premature thermal fatigue stress cracking, and can also be subject to erosion due to the abrasive nature of the catalyst particles.

SUMMARY OF THE INVENTION

In one embodiment, a tubular fluid flow device of varying outside dimensions is adapted for use in a high pressure, rapidly cycling temperature environment. The flow device can have a tubular member having at least one locus of non-uniform outside dimension and an axial flow passage with a uniform inside diameter between opposite end connection elements. A thermal sleeve liner can be disposed about the axial flow passage in a bore formed in the tubular member, wherein the sleeve comprises an outer surface having a thermal barrier coating. A pressure-relief passage is provided in fluid communication with an interface between an exterior surface of the thermal sleeve liner and an inner surface of the bore.

In another embodiment, an isolation ball valve has a pair of opposing ball valve members connected on either end of an end connector, wherein the end connector comprises the tubular fluid flow device described above. In an embodiment, the tubular member has seat recesses to retain seals adjacent the ball valve members. In an embodiment, the pressure-relief passage comprises an annular passage formed by an axial offset between an end of the thermal sleeve liner and the respective seals. In another embodiment, the pressure-relief passage comprises a transverse bore through an outer wall of the tubular member. In another embodiment, termini of the thermal sleeve liner have welded seals with the tubular member adjacent the ball valve members.

In another embodiment, the tubular fluid flow device can have flanged end connections, and in an embodiment, the tubular member has a uniform outside diameter between the flanged end connections.

In another embodiment, the thermal sleeve liner is fit in the bore, for example, by press fitting or shrink fitting.

In embodiments, the thermal barrier coating can be ceramic, such as, for example, zirconia, such as, for example, yttria-stabilized zirconia, or the like. In an embodiment, the thermal sleeve liner comprises a hardened, heat-resistant material. In an embodiment, the tubular fluid flow device can include a bond layer between an outer surface of the thermal sleeve liner and the thermal barrier coating.

In another embodiment, a ball valve isolation method is provided for a rapidly cycling temperature service. The method can include installing the isolation ball valve in a line and cycling operation of the isolation ball valve in service at a temperature swing of at least 250° C. at a frequency of at least one cycle per week, wherein the thermal sleeve liner is effective to inhibit thermal fatigue stress cracking in the end connector. In one embodiment, alternating thermal stresses developed in the tubular member are less than 360 MPa (52 ksi). In another embodiment, peak alternating thermal stresses developed in the tubular member are sufficiently low to achieve a design life of at least 30,000 cycles. In an embodiment, the method can further include servicing the isolation ball valve by removing and replacing the thermal sleeve liner.

In another embodiment, a method is provided for the transfer of catalyst from a reactor, such as, for example, an ebullated bed reactor. The method can include positioning the isolation ball valve described herein in a conduit exiting the reactor and cycling the isolation ball valve between an open position to transfer catalyst from the reactor and a closed position to stop the catalyst transfer.

The various embodiments described here can be applied singly or in any suitable or compatible combination or permutation of the embodiments.

DETAILED DESCRIPTION

Figure 1:
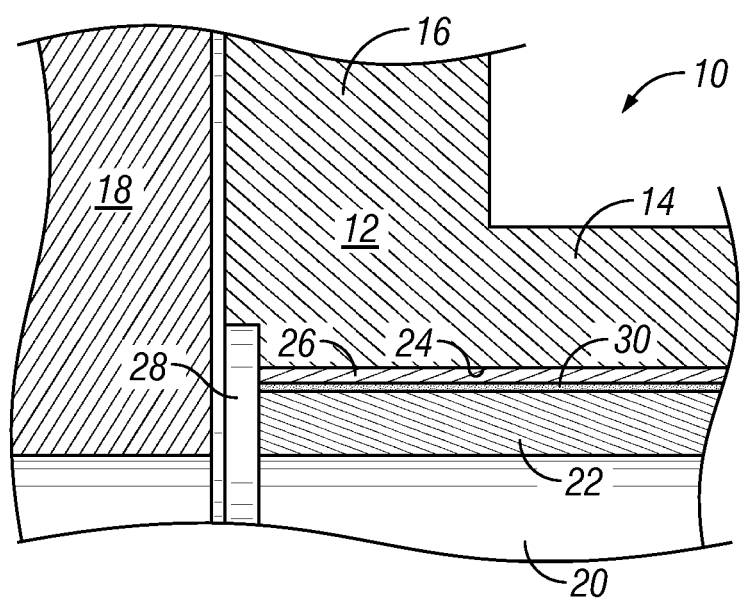
FIG. 1 is a schematic diagram of a wall section of a tubular fluid flow device according to an embodiment.

An embodiment of the present invention can provide a tubular fluid flow device of varying outside dimensions that is adapted for use in a rapidly cycling temperature environment. In an embodiment, the temperature cycling can also include pressure cycling, for example, as much as 10 MPa or 14 MPa or more between cycles. With reference to FIG. 1 there is shown a schematic diagram of a wall section of a tubular fluid flow device 10 having a tubular member 12 having at least one locus of non-uniform outside dimension, comprising the embodiment wherein a medial section 14 of uniform outside diameter is adjacent an end section 16 having a relatively larger outside diameter. The end section 16 in an embodiment comprises a flange, for example, which can be bolted to the mating flange of an adjacent flow element 18, for example, which can be a ball housing or seat.

An axial flow passage 20 is provided between opposite end connection elements 16. In one embodiment the passage 20 has a uniform inside diameter, optionally with an outward flare adjacent one or both of the end connection elements 16. A thermal sleeve liner 22 can be disposed about the axial flow path 20 in a bore 24 formed in the tubular member 12, wherein the sleeve comprises an outer surface having a thermal barrier coating 26. A pressure-relief passage 28 is provided in fluid communication between the axial flow passage 20 and an interface between an exterior surface of the thermal sleeve liner and an inner surface of the bore 24. The passage 28 can be terminated in various embodiments by a raised face and/or gasket in sealing contact with the adjacent flow element 18, for example. Additionally or alternatively, the pressure-relief passage can be disposed as a similar passage at the opposite end connection and/or intermediate between the ends as a radial or pinhole passage.

The size of the passage 28 should be sufficient to allow vapor to escape to avoid a buildup of pressure due to thermal expansion of vapor trapped at the interface, which might result in delamination or failure of the sleeve liner 22 and/or thermal barrier coating 26. On the other hand, the passage 28 should not be so large that the thermal barrier coating 26 would be effectively short circuited. Where the passage 28 is an annular or radial passage in an embodiment, a ratio of the diameter of the bore 24 to the axial length (width) of the passage 28 in one embodiment is within the range of from 25:1 to 100:1, and in another embodiment the axial length (width) of the passage 28 is from 0.01 to 0.1 in. (0.25 to 2.5 mm).

The thermal barrier coating 26 can be formed of a ceramic such as zirconia or yttrium-stabilized zirconia, which is known to be applied by any number of coating techniques such as plasma spraying, flame spraying, vapor deposition, or the like, over an optional bond coat 30. The coating 26 is disposed on the exterior surface of the sleeve where it is not subject to wear from erosive or corrosive fluid which may flow through the passage 20. The sleeve liner 22 can be made of a wear and heat resistant material such as including but not limited to, carbides, cobalt-chromium-tungsten alloys available under the trade designation STELLITE, for example, and the like, whereas the tubular member 12 may be constructed of a relatively more economical material such as carbon steel. If desired, an additional thermal coating could optionally be applied to the inner surface of the sleeve liner 22 with or without an intermediate bond coat.

Figure 2:
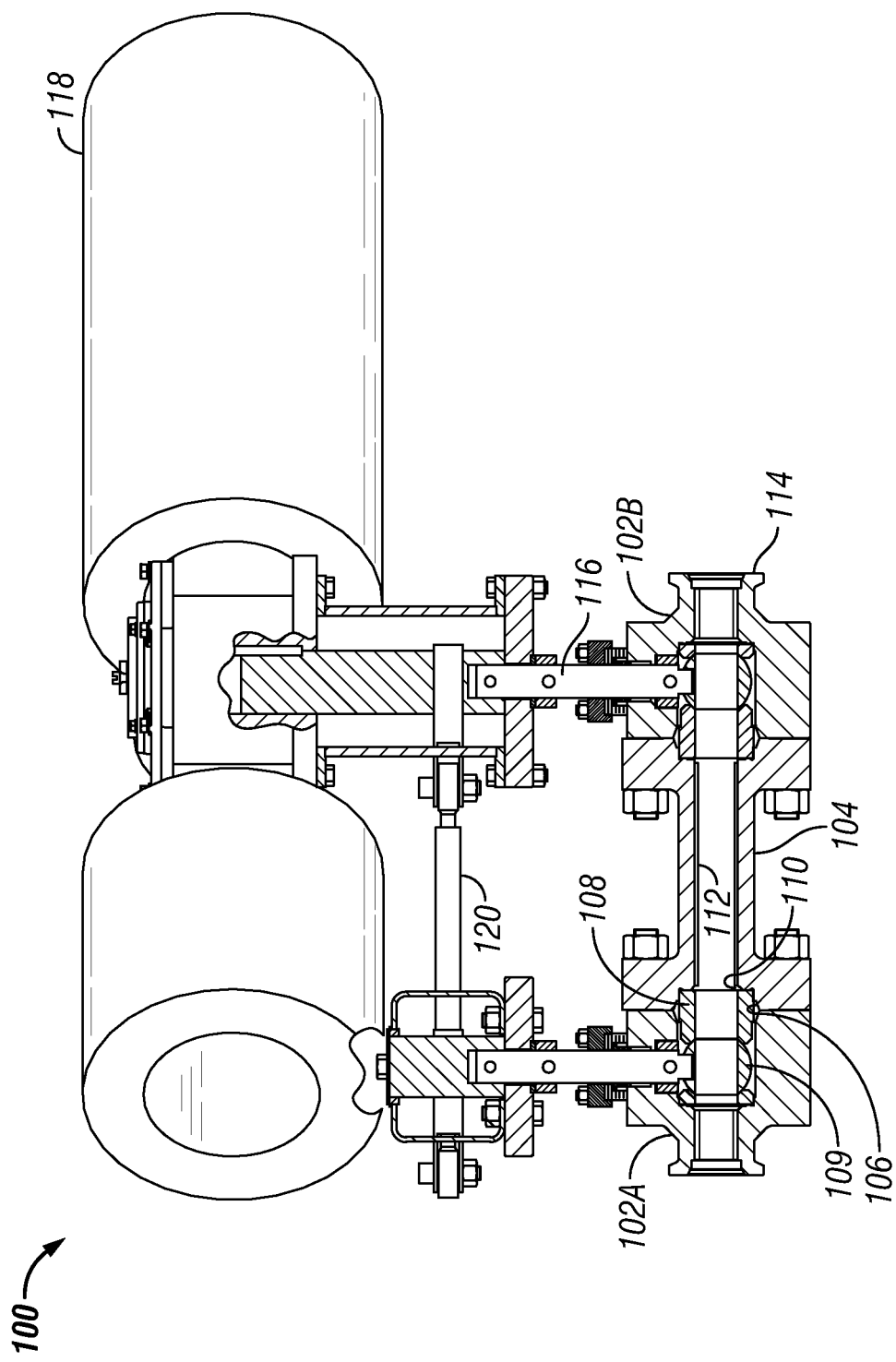
FIG. 2 is a side elevation, partly cut away, of an isolation ball valve according to one embodiment of the present invention.

With reference to the embodiment of FIGS. 2-7, an isolation ball valve 100 has a pair of opposing ball valve members 102A, 102B connected on either end of an end connector 104 comprising the tubular fluid flow device. In an embodiment, the tubular member 104 has respective seat recesses 106 to retain seat rings 108 adjacent the ball 109 in the ball valve members 102A, 102B. In an embodiment, the pressure-relief passages comprise annular passages 110 formed by an axial offset between an end of the thermal sleeve liner 112 (see FIGS. 5-7) and the respective seat rings 108 (FIG. 2).

Figure 3:
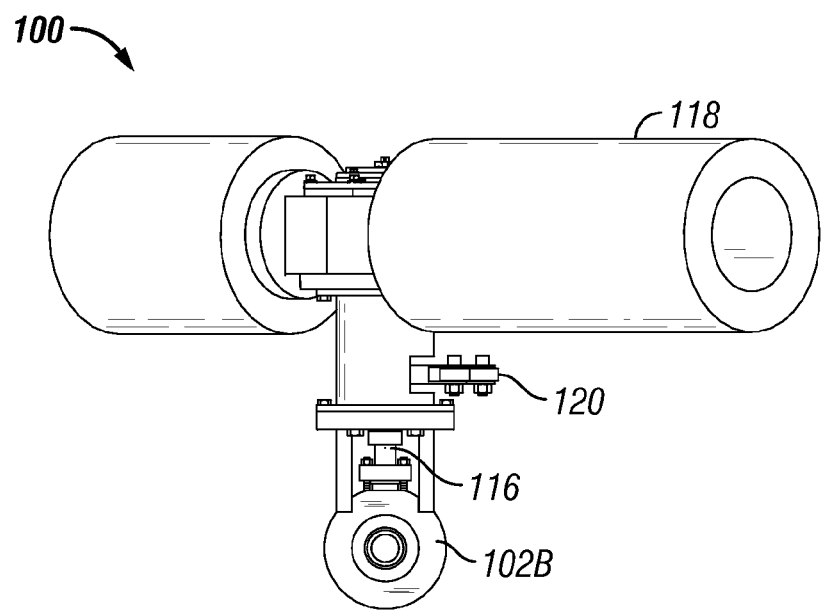
FIG. 3 is an end view of the isolation ball valve of FIG. 2.
Figure 4:
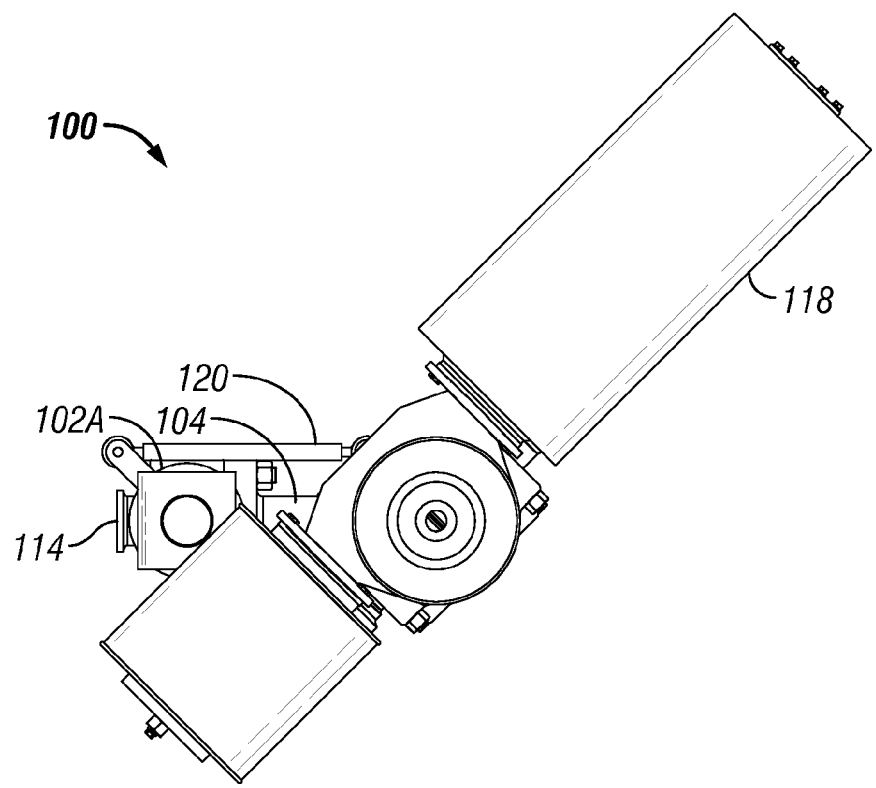
FIG. 4 is a top plan view of the isolation ball valve of FIGS. 2-3.

FIG. 2 is a side elevation, partly cut away, of the isolation ball valve 100 according to one embodiment of the present invention. FIG. 3 is an end view of the isolation ball valve 100, and FIG. 4 is a top plan view. The ball valve members 102A, 102B are disposed with the respective pressure ends 114 facing outwardly opposite the end connector 104 and can be provided with respective stems 116. A dual operator 118 can be provided to simultaneously open and close the ball valve members 102A, 102B by rotation of the respective balls 109 via stems 116 and linkage rod 120.

Figure 5:
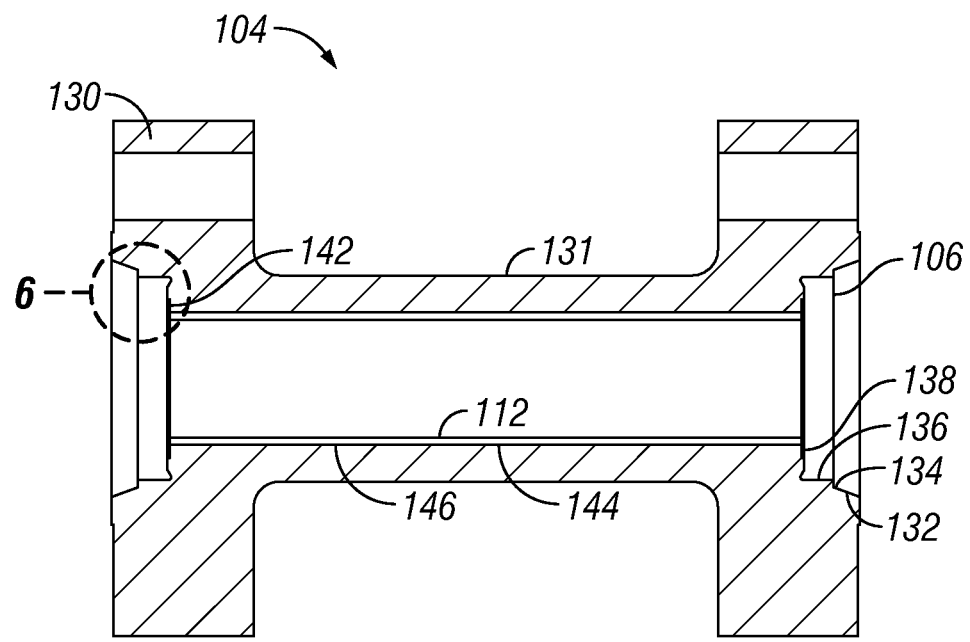
FIG. 5 is an enlarged sectional view of the end connector used in the isolation ball valve of FIGS. 2-4.
Figure 6:
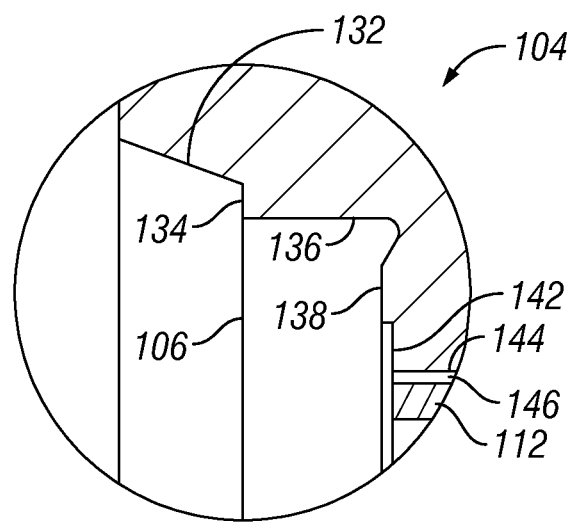
FIG. 6 is an enlarged detail of area 6 encircled in FIG. 5.
Figure 7:
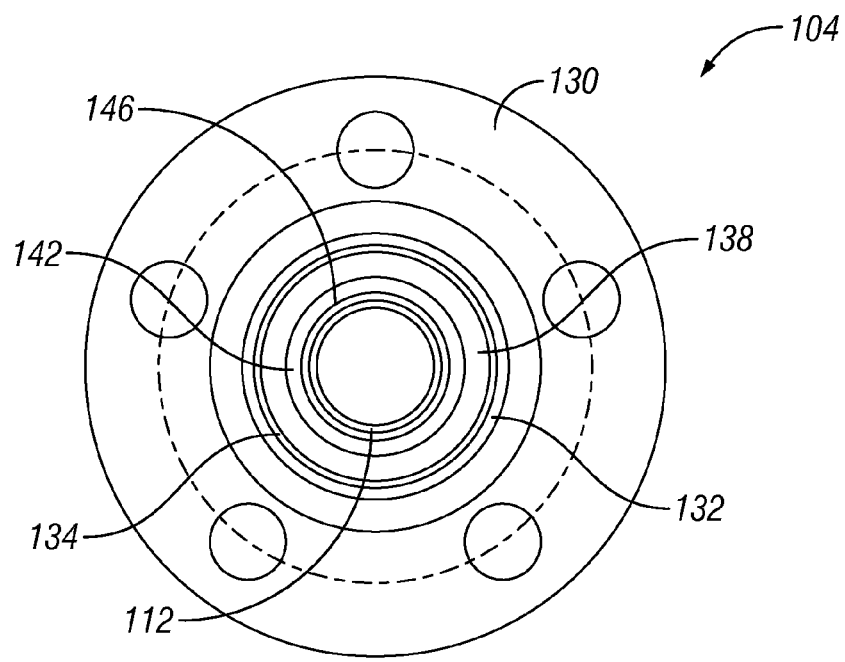
FIG. 7 is an end view of the end connector of FIGS. 5-6.

FIG. 5 is an enlarged sectional view of the end connector 104 used in the isolation ball valve 100 between the ball valve members 102A, 102B. FIG. 6 is an enlarged detail of area 6 encircled in FIG. 5, and FIG. 7 is an end view of the end connector 104. The end connector 104 has flanges 130 formed at either end thereof for bolted connection with the respective low pressure end 114 of the body of ball valve members 102A, 102B (see FIG. 2), and a uniform outside diameter 131 intermediate the flanges 130. As best seen in FIG. 6, seat recesses 106 include a chamfer 132, an intermediate annular face 134, a cylindrical section 136 and an inner annular face 138 with an intermediate raised surface to seat against the seat ring 108 and an inner recessed face 142 adjacent an axial bore 144, which together with the seat ring 108 defines the radial passage 110 (see FIG. 2). The sleeve 112 is disposed in the bore 144 and has a thermal barrier coating 146 thereon.

Figure 8:
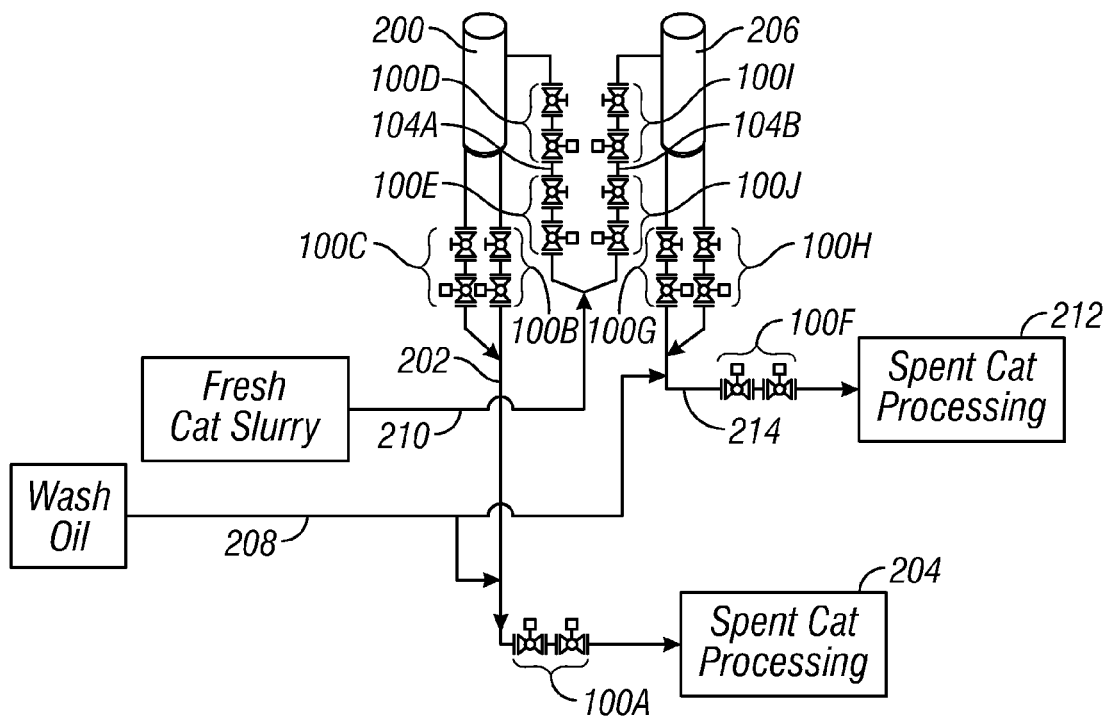
FIG. 8 is a schematic diagram of an ebullated bed reactor unit incorporating the isolation ball valve of FIGS. 2-7 according to an embodiment.

FIG. 8 is a schematic diagram of an ebullated bed catalytic reactor unit incorporating the isolation ball valves 100 of FIGS. 2-7 according to an embodiment. The spent catalyst slurry can be transferred from first reactor 200 via transfer line 202 and valve sets 100A, 100B, 100C to first spent catalyst processing unit 204, while second reactor 206 is kept operating in normal service or serviced similarly at the same time. Flushing oil can also be supplied from line 208 behind the spent catalyst slurry to wash the line 202 and valve sets 100A and/or 100B, 100C. Then the valve sets 100A, 100B, 100C are closed, and when it is desired to recharge the first reactor 200, fresh catalyst slurry is supplied via line 210 and the valve sets 100D, 100E are opened to introduce the fresh catalyst into the reactor 200. The valve sets 100D and 100E can also include an additional end connector 104A between the adjacent valves in each of the sets 100D, 100E. When the reactor 200 is completely charged with catalyst, the valve sets 100D, 100E are closed and the reactor 200 is placed back online until the next catalyst withdrawal cycle is initiated.

Second reactor 206 can be serviced similarly by transferring spent catalyst to second spent catalyst processing 212 via valve sets 100F, 100G, 100H and line 214, and supplying a fresh charge of catalyst via line 210 and valve sets 100I, 100J and end connector 104B. The lines 202, 210 and 214 can, if desired, include additional similar or dissimilar valves (not shown) for redundancy, flow control, or the like. In alternate embodiments, a single or multiple lines can be used to withdraw catalyst from a single or multiple reactor locations, respectively, as an alternative to the two shown for each of the reactors 200, 206 in FIG. 8. In a further embodiment, the catalyst withdrawal and recharge can be effected for each reactor via a dual purpose line provided with the valves sets 100 as needed.

EXAMPLE

An isolation ball valve, substantially as shown in FIGS. 2-7 except that it did not use an internal thermal sleeve liner, was used in a catalyst transfer service subjected to extreme pressure and temperature swings between ambient and in excess of 14 MPa and 400° C. on a 10-hour cycle. The end connector 104 had an inside diameter of 58.04 mm (2.285 inches), an outside diameter of 101.6 mm (4 inches) and flanges rated for 17.2 MPa (2500 psi). During shutdown an inspection revealed cracks formed in the interior wall of the end connector, and these were determined to be thermal stress cracking. A finite element analysis using a coupled thermal-pressure transient analysis was performed on a two-dimensional axisymmetric model without the sleeve liner and using a time and grid convergence study. The peak stress intensity in the end connector at the point formed by the inner bore and seat ring cavity was calculated at 841 MPa (122 ksi). Fatigue analysis based on American Society of Mechanical Engineers (ASME) fatigue design curve showed a design life in the range of 50 to 200 cycles.

The finite element analysis was repeated using a model with the thermal sleeve liner according to an embodiment of the present invention with the thermal coating only on the outer surface of the liner and also with the thermal coating on both the inner and outer surfaces of the liner, wherein the liner base material had a thickness of 3.175 mm (0.125 inches) and the coating had a thickness of 1.27 mm (0.05 inches). The peak stress intensities at the same point in the inventive end connectors were 321 MPa (46.6 ksi) and 446 MPa (64.7 ksi), respectively. Fatigue analysis based on the ASME fatigue design curve showed a design life of at least 30,000 cycles was achieved for both designs, i.e., a coating either on the outside surface only of the liner sleeve or on both the inner and outer surfaces.

It will be seen from the present disclosure that a tubular fluid flow device of varying outside dimensions adapted for use in a rapidly cycling temperature environment has been provided, including the following embodiments:

Embodiment 1

A tubular fluid flow device of varying outside dimensions for use in a rapidly cycling temperature environment, comprising a tubular member (10) having at least one locus of non-uniform outside dimension (14, 16) and an axial flow passage (20) with a uniform inside diameter between opposite end connection elements (16); a thermal sleeve liner (22) disposed about the axial flow passage in a bore (24) formed in the tubular member, wherein the sleeve comprises an outer surface having a thermal barrier coating (26); and a pressure-relief passage (28) in fluid communication with an interface between an exterior surface of the thermal sleeve liner and an inner surface of the bore.

Embodiment 1A

Embodiment 1 wherein the pressure-relief passage is in fluid communication with the axial flow passage.

Embodiment 1B

Embodiment 1 wherein the pressure-relief passage is in fluid communication with an external surface of the tubular member.

Embodiment 1C

Embodiment 1, 1A or 1B wherein the pressure-relief passage is annular.

Embodiment 1D

Embodiment 1, 1A or 1B wherein the pressure-relief passage is radial.

Embodiment 2

An isolation ball valve, comprising a pair of opposing ball valve members (102A, 102B) connected on either end of an end connector (104), wherein the end connector comprises the tubular fluid flow device of any one of Embodiment 1 to 1D.

Embodiment 3

Any one of Embodiment 1 to 2 wherein the tubular member has seat recesses (106) to retain seals (108) adjacent the ball valve members.

Embodiment 4

Embodiment 3 wherein the pressure-relief passages comprise annular passages formed by an axial offset between an end of the thermal sleeve liner and the respective seals.

Embodiment 5

Any one of Embodiment 1 to 4 comprising flanged end connections and wherein the tubular member has a uniform outside diameter between the flanged end connections.

Embodiment 6

Any one of Embodiment 1 to 5 wherein the thermal sleeve liner is fitted in the bore.

Embodiment 7

Embodiment 6 wherein the thermal sleeve liner is press fitted in the bore.

Embodiment 8

Embodiment 6 wherein the thermal sleeve liner is shrink fitted in the bore.

Embodiment 9

Any one of Embodiment 1 to 5 wherein the thermal sleeve liner is welded in the bore.

Embodiment 10

Any one of Embodiment 1 to 9 wherein the thermal barrier coating comprises ceramic.

Embodiment 11

Any one of Embodiment 1 to 10 wherein the thermal barrier coating comprises zirconia.

Embodiment 12

Any one of Embodiment 1 to 11 wherein the thermal barrier coating is yttria-stabilized.

Embodiment 13

Any one of Embodiment 1 to 12 wherein the thermal sleeve liner comprises a hardened, heat-resistant material.

Embodiment 14

Any one of Embodiment 1 to 13 further comprising a bond layer (30) between an outer surface of the thermal sleeve liner and the thermal barrier coating.

Embodiment 15

A ball valve isolation method for a high pressure, rapidly cycling temperature service, comprising: installing the isolation ball valve (204, 208) of Embodiment 2 or any one of Embodiment 3 to 14 as relating to Embodiment 2 in a line (202); cycling operation of the isolation ball valve in service at a temperature swing of at least 250° C. at a frequency of at least one cycle per week; wherein the thermal sleeve liner is effective to inhibit thermal fatigue stress cracking in the end connector.

Embodiment 16

A method for the transfer of catalyst from an FCC regeneration unit, comprising: positioning the isolation ball valve (204, 208) of Embodiment 2 or any one of Embodiment 3 to 14 as relating to Embodiment 2 in a conduit (202) exiting the catalyst regeneration unit (200); cycling the isolation ball valve between an open position to transfer catalyst from the reactor and a closed position to stop the catalyst transfer.

Embodiment 17

Embodiment 15 or 16 wherein alternating thermal stresses developed in the tubular member are less than 52 ksi (360 MPa).

Embodiment 18

Embodiment 15, 16 or 17 wherein peak alternating thermal stresses developed in the tubular member are sufficiently low to achieve a design life of at least 30,000 cycles.

Embodiment 19

Any one of Embodiment 15 to 18 further comprising servicing the isolation ball valve by removing and replacing the thermal sleeve liner.

The invention is described above in reference to specific embodiments for illustrative and non-limiting purposes. Various modifications and variations will occur to the skilled artisan in view thereof. It is intended that all such modifications and variations within the scope and spirit of the appended claims be embraced thereby.

The invention claimed is:

1. A tubular fluid flow device of varying outside dimensions for use in a rapidly cycling temperature environment, comprising:
    a tubular member (10) having at least one locus of non-uniform outside dimension (14, 16) and an axial flow passage (20) with a uniform inside diameter between opposite end connection elements (16);
    a thermal sleeve liner (22) disposed about the axial flow passage in a bore (24) formed in the tubular member;
    a thermal barrier coating (26) disposed on an exterior surface of the thermal sleeve liner (22) located at an interface between and in direct contact with the exterior surface of the thermal sleeve liner and an inner surface of the bore; and
    a pressure-relief passage (28) in fluid communication with the interface between the exterior surface of the thermal sleeve liner and the inner surface of the bore.

2. An isolation ball valve, comprising a pair of opposing ball valve members (102A, 102B) connected on either end of an end connector (104), wherein the end connector comprises the tubular fluid flow device of claim 1.

3. The isolation ball valve of claim 2 wherein the tubular member has seat recesses (106) to retain seals (108) adjacent the ball valve members.

4. The isolation ball valve of claim 3 wherein the pressure-relief passage comprises annular passages formed by an axial offset between an end of the thermal sleeve liner and the respective seals.

5. The tubular fluid flow device of claim 1 comprising flanged end connections and wherein the tubular member has a uniform outside diameter between the flanged end connections.

6. The tubular fluid flow device of claim 1 wherein the thermal sleeve liner is press fitted in the bore, shrink fitted in the bore, welded in the bore, or a combination thereof.

7. The tubular fluid flow device of claim 1 wherein the thermal barrier coating comprises ceramic.

8. The tubular fluid flow device of claim 1 wherein the thermal barrier coating comprises zirconia.

9. The tubular fluid flow device of claim 1 wherein the thermal barrier coating comprises yttria-stabilized zirconia.

10. The tubular fluid flow device of claim 1 wherein the thermal sleeve liner comprises a hardened, heat-resistant material.

11. The tubular fluid flow device of claim 1, further comprising a bond layer (30) between and in direct contact with the exterior surface of the thermal sleeve liner and the thermal barrier coating such that the thermal barrier coating (26) is disposed between and in direct contact with the bond layer of the thermal sleeve liner and an inner surface of the bore.

12. A ball valve isolation method for a high pressure, rapidly cycling temperature service, comprising:
    installing an isolation ball valve (204, 208) in a line (202) comprising a pair of opposing ball valve members (102A, 102B) connected on either end of an end connector (104) comprising a tubular fluid flow device; and
    cycling operation of the isolation ball valve in service at a temperature swing of at least 250° C. at a frequency of at least one cycle per week;
    wherein the tubular fluid flow device comprises a tubular member (10) having at least one locus of non-uniform outside dimension (14, 16) and an axial flow passage (20) with a uniform inside diameter between opposite end connection elements (16);
    a thermal sleeve liner (22) disposed about the axial flow passage in a bore (24) formed in the tubular member, wherein the sleeve comprises an outer surface having a thermal barrier coating (26); and
    a pressure-relief passage (28) in fluid communication with an interface between an exterior surface of the thermal sleeve liner and an inner surface of the bore, and
    wherein the thermal sleeve liner is effective to inhibit thermal fatigue stress cracking in the end connector.

13. The ball valve isolation method of claim 12 wherein alternating thermal stresses developed in the tubular member are less than 52 ksi (360 MPa).

14. The ball valve isolation method of claim 12 wherein peak alternating thermal stresses developed in the tubular member are sufficiently low to achieve a design life of at least 30,000 cycles.

15. The ball valve isolation method of claim 12 further comprising servicing the isolation ball valve by removing and replacing the thermal sleeve liner.

16. A method for the transfer of catalyst from a reactor, comprising:
- positioning an isolation ball valve (100A to 100C, 100F to 100G) in a conduit (202, 214) exiting the reactor (200, 206); and
- cycling the isolation ball valve between an open position to transfer catalyst from the reactor and a closed position to stop the catalyst transfer,
- wherein the isolation ball valve comprises a pair of opposing ball valve members (102A, 102B) connected on either end of an end connector (104) comprising a tubular fluid flow device comprising a tubular member (10) having at least one locus of non-uniform outside dimension (14, 16) and an axial flow passage (20) with a uniform inside diameter between opposite end connection elements (16);
- a thermal sleeve liner (22) disposed about the axial flow passage in a bore (24) formed in the tubular member;
- a thermal barrier coating (26) disposed on an exterior surface of the thermal sleeve liner (22) located at an interface between and in direct contact with the exterior surface of the thermal sleeve liner and an inner surface of the bore; and
- a pressure-relief passage (28) in fluid communication with the interface between the exterior surface of the thermal sleeve liner and the inner surface of the bore.

17. The catalyst transfer method of claim 16 wherein alternating thermal stresses develop in the tubular member, and wherein the alternating thermal stresses developed in the tubular member are less than 52 ksi (360 MPa).

18. The catalyst transfer method of claim 16 wherein peak alternating thermal stresses develop in the tubular member, and wherein the peak alternating thermal stresses developed in the tubular member are sufficiently low to achieve a design life of at least 30,000 cycles.

19. The catalyst transfer method of claim 16 further comprising servicing the isolation ball valve by removing and replacing the thermal sleeve liner.

20. The tubular fluid flow device of claim 1, wherein the pressure-relief passage (28) comprises an annular passage formed by an axial offset between an end of the thermal sleeve liner and an inner recessed face adjacent the bore (24), in fluid communication with the interface between the exterior surface of the thermal sleeve liner and the inner surface of the bore.

* * * * *